(12) United States Patent
Zhao

(10) Patent No.: US 9,209,299 B2
(45) Date of Patent: Dec. 8, 2015

(54) TRANSISTOR DEVICE AND FABRICATION METHOD

(71) Applicant: Semiconductor Manufacturing International (Shanghai) Corporation, Shanghai (CN)

(72) Inventor: Meng Zhao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/189,088

(22) Filed: Feb. 25, 2014

(65) Prior Publication Data

US 2015/0162444 A1    Jun. 11, 2015

(30) Foreign Application Priority Data

Dec. 10, 2013   (CN) .......................... 2013 1 0673659

(51) Int. Cl.
| H01L 29/78 | (2006.01) |
| H01L 29/66 | (2006.01) |
| H01L 29/06 | (2006.01) |
| H01L 21/425 | (2006.01) |

(52) U.S. Cl.
CPC .......... *H01L 29/7842* (2013.01); *H01L 21/425* (2013.01); *H01L 29/0619* (2013.01); *H01L 29/66477* (2013.01)

(58) Field of Classification Search
CPC .................... H01L 29/7842; H01L 29/66477
See application file for complete search history.

(56) References Cited

U.S. PATENT DOCUMENTS

| 6,784,098 B1 * | 8/2004 | Lou ................................ 438/645 |
| 2013/0207166 A1 * | 8/2013 | Chen et al. ..................... 257/288 |

* cited by examiner

*Primary Examiner* — Marc Armand
(74) *Attorney, Agent, or Firm* — Anova Law Group, PLLC

(57) ABSTRACT

A transistor and a fabrication method are provided. In an exemplary transistor, a gate structure is formed on a surface of the substrate. A first doped region is formed in the substrate on both sides of the gate structure. An opening is formed in the first doped region. A stress layer is formed in the opening of the first doped region on the both sides of the gate structure. The stress layer has a thickness in the substrate less than a depth of the first doped region. The first doped region has a bottom in the substrate surrounding a bottom of the stress layer. The stress layer further contains a second doped region. The second doped region and the first doped region form a source region or a drain region.

20 Claims, 4 Drawing Sheets

TRANSISTOR DEVICE AND FABRICATION METHOD

CROSS-REFERENCES TO RELATED APPLICATIONS

This application claims the priority to Chinese Patent Application No. CN201310673659.9, filed on Dec. 10, 2013, which is incorporated herein by reference in its entirety.

FIELD OF THE DISCLOSURE

The present disclosure generally relates to the field of semiconductor manufacturing technology and, more particularly, relates to transistors and their fabrication methods.

BACKGROUND

As a basic semiconductor device, transistors are widely used. With increase of component density and integration degree of semiconductor devices, gate size of transistors becomes shorter than before. However, the shortened gate of transistors can generate a short channel effect in transistors, thus causing leakage current and ultimately affecting electrical performance of semiconductor devices. Currently, a conventional technology mainly focuses on improving stress of the channel region in a transistor to enhance carrier mobility, thereby increasing drive current of the transistor to reduce leakage current.

A conventional method of improving stress of the channel region in a transistor includes: forming a stress layer in the source/drain region of the transistor. In a PMOS transistor, the stress layer can be made of silicon germanium (SiGe), thus compressive stress is generated due to crystal lattice mismatch between silicon and silicon germanium, thereby improving performance of the PMOS transistor. In an NMOS transistor, the stress layer can be made of silicon carbide (SiC), thus tensile stress is generated due to crystal lattice mismatch between silicon and silicon carbide, thereby improving performance of the NMOS transistor.

FIGS. 1-3 show cross sectional views of a conventional transistor having a stress layer at various formation stages. As shown in FIGS. 1-3, the fabrication method includes: providing a semiconductor substrate 10 having a gate structure 11 on a top surface of the semiconductor substrate 10 and containing a well region in the semiconductor substrate 10 (FIG. 1); forming openings 12 in the semiconductor substrate 10 on both sides of the gate structure 11, the sidewalls of the openings 12 and the surface of the semiconductor substrate 10 being configured to be a "Σ" (Sigma) shape having a vertex extending to the bottom of the gate structure 11 (FIG. 2); and forming a stress layer 13 in the openings 12 by a selective epitaxial deposition process, the stress layer 13 being made of silicon germanium or silicon carbide.

According to the conductive type of a transistor, the stress layer 13 can be doped with P-type or N-type ions to form a source region and a drain region in the semiconductor substrate 10 on both sides of the gate structure to form a PMOS transistor and a NMOS transistor. Type of doped ions in the well region is opposite to the type of doped ions in the stress layer 13.

However, a transistor having a stress layer formed by a conventional method is still prone to leakage current or a short channel effect with undesirable performance.

BRIEF SUMMARY OF THE DISCLOSURE

One aspect of the present disclosure includes a method for fabricating a transistor. A gate structure is formed on a surface of a substrate. A first doped region is formed in the substrate on both sides of the gate structure. An opening is formed in the first doped region. A stress layer is formed in the opening of the first doped region on the both sides of the gate structure. The stress layer has a thickness in the substrate less than a depth of the first doped region. The first doped region has a bottom in the substrate surrounding a bottom of the stress layer. The stress layer contains a second doped region. The second doped region and the first doped region form a source region or a drain region.

Another aspect of the present disclosure includes a transistor. The transistor includes a substrate, a gate structure, a first doped region, and a stress layer. The gate structure is disposed on a surface of the substrate. The first doped region is disposed in the substrate on both sides of the gate structure. The first doped region includes an opening. The stress layer is disposed in the opening of the first doped region on the both sides of the gate structure. The stress layer has a thickness in the substrate less than a depth of the first doped region. The first doped region has a bottom in the substrate surrounding a bottom of the stress layer. The stress layer contains a second doped region. The second doped region and the first doped region form a source region or a drain region.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
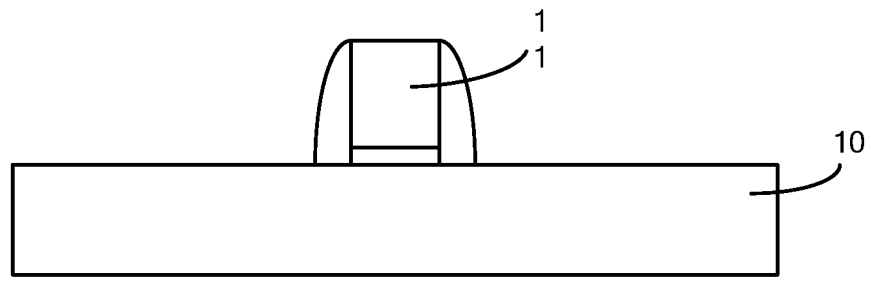
FIGS. 1-3 depict cross sectional views of a conventional transistor having a stress layer at various formation stages.
Figure 2:
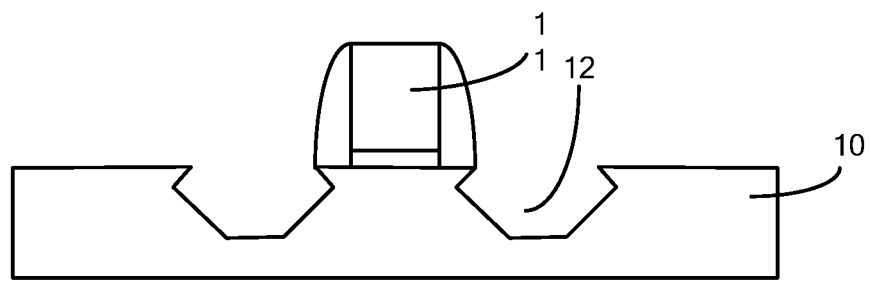
Figure 3:
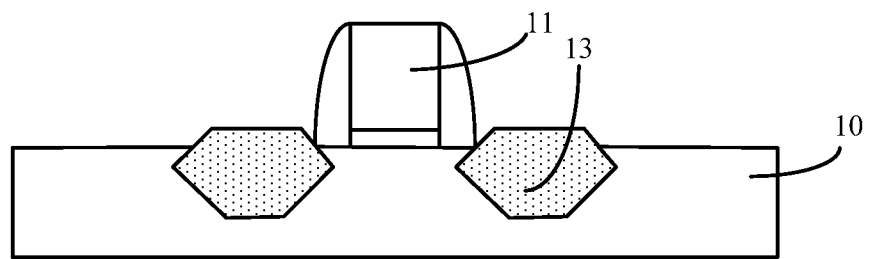

A transistor having a stress layer formed by a conventional method is prone to generating leakage current or a short channel effect with undesirable performance. In FIG. 3, the type of doped ions in the well region is opposite to the type of doped ions in the source region or the drain region, hence a PN junction can be formed between the well region and the source region (or the drain region). When a reverse breakdown current is generated in the PN junction, a leakage current may occur between the source/drain region and the semiconductor substrate.

Still in FIG. 3 for a transistor having a stress layer 13, strong electric field strength occurs at a boundary between the stress layer 13 and the semiconductor substrate 10, to promote electromigration between the source/drain region and the substrate 10. In an area near the top of the stress layer 13, high electric field strength can increase electromigration of the channel region between the source region and the drain region. However, in an area near the bottom of the stress layer 13, high electric field strength can increase electromigration between the source/drain region and the well region, thus resulting in an increase of leakage current in the area near the bottom of the stress layer 13.

Specifically, the sidewalls of the stress layer 13 with respect to the surface of the semiconductor substrate 10 is configured to be a "Σ" shape, thus the bottom of the formed stress layer 13 has a small size. When forming the source region or the drain region in the stress layer 13, a small number of doped ions are in the bottom of the stress layer 13. Consequently, a small depletion layer is formed between a portion of the source/drain region at the bottom of the stress layer 13 and the well region in the semiconductor substrate 10. Reduction of electric field strength by such small depletion layer is limited, resulting in undesirable leakage current in a region near the bottom of the stress layer 13.

A reverse breakdown voltage of a PN junction is determined by a concentration difference of doped ions in a P region or an N region, as such, a conventional method of suppressing the leakage current can include doping the semiconductor substrate 10 with non-P-type or non-N-type impurity ions, to increase a doping concentration difference between the source/drain region and the well region. However, doping the semiconductor substrate 10 with impurity ions can increase the resistance of a channel region between the source region and the drain region to form a transistor with undesired performance.

Another conventional method of suppressing the leakage current can include increasing the depth of a source region or a drain region to surround the stress layer 13 with the source region or the drain region. The range of a depletion region surrounding the bottom of the stress layer 13 can be increased to sufficiently reduce the electric field strength between the bottom of the stress layer 13 and the semiconductor substrate 10. A leakage current can thus be prevented from generating in a region near the bottom of the stress layer 13.

For a transistor as shown in FIG. 3, to form source/drain regions surrounding the bottom of the stress layer 13, it is necessary for an ion implantation process, after forming the stress layer 13, to deepen the doping depth, increase the doping concentration, and increase the number of doping. However, even if a source/drain region surrounding the stress layer 13 are able to be formed by increasing the doping depth, increasing the doping concentration and increasing the number of doping processes, meanwhile, the doping concentration in the source/drain regions can be increased as well. This thereby increases the transverse diffusion capacity of the source/drain regions to shorten the channel length between the source region and the drain region. Thus a short channel effect can be produced to result in a formed transistor with undesired performance.

Moreover, even when the doping depth and doping concentration as well as the number of doping processes are increased, cross-sectional shapes of the formed source/drain regions are not stable enough to surround the bottom region of the stress layer 13. Thus, suppression of leakage current near the bottom region of the stress layer 13 is limited.

As disclosed herein, a transistor and a method for fabricating the transistor are provided. The fabrication method can include, e.g., forming a first doped region and a stress layer in a substrate on both sides of a gate structure. The thickness of the stress layer is less than the depth of the first doped region. The bottom of the first doped region surrounds the bottom of the stress layer. Because the first doped region can surround the stress layer, the range of a depletion layer formed between the first doped region and the substrate can be expanded to sufficiently reduce the electric field strength between the bottom of the stress layer and the substrate. Thus, a leakage current between the bottom of the stress layer and the substrate can be suppressed.

In addition, after forming the stress layer and the first doped region, a second doped region can be formed in the stress layer. Doping parameters (e.g., doping depth and doping concentration) of the second doped region can be precisely controlled in a doping process. Thus diffusion of the formed second doped region can be suppressed through a doping process to avoid a short channel effect from occurring. Consequently, when using the formed first doped region and the formed second doped region as a source/drain region, a leakage current can be suppressed, and production of a short-channel effect can be avoided. The formed transistor thus has an improved performance.

Figure 7:
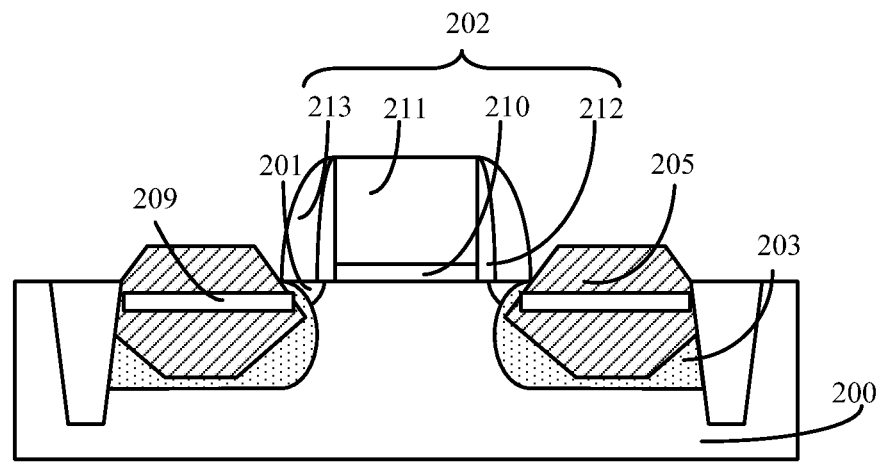
Figure 8:
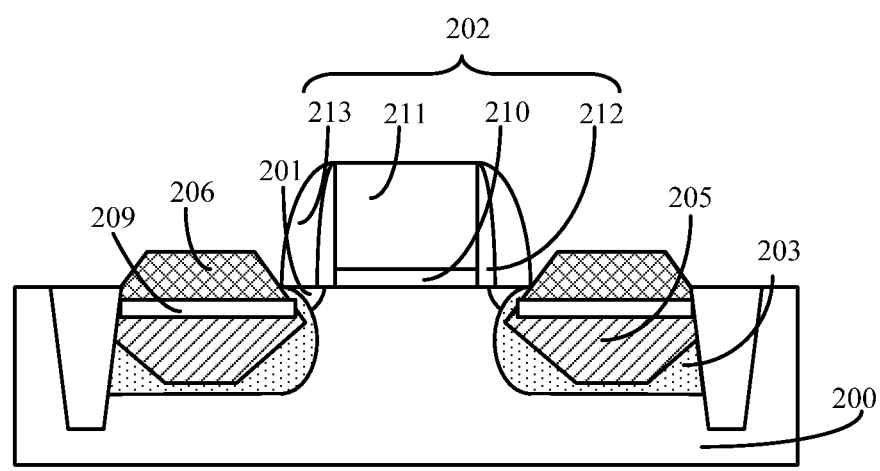
Figure 9:
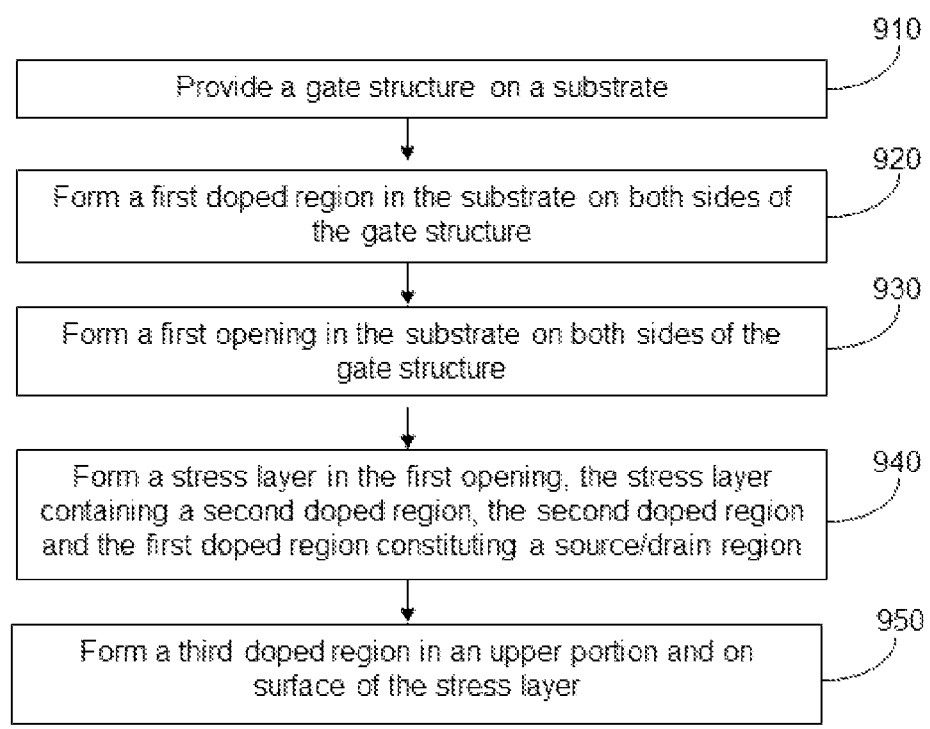
FIG. 9 depicts an exemplary method for forming a transistor in accordance with various disclosed embodiments.

FIGS. 4-8 are schematics for an exemplary transistor at various stages during formation in accordance with various disclosed embodiments, while FIG. 9 depicts an exemplary method for forming a transistor in accordance with various disclosed embodiments.

Figure 4:
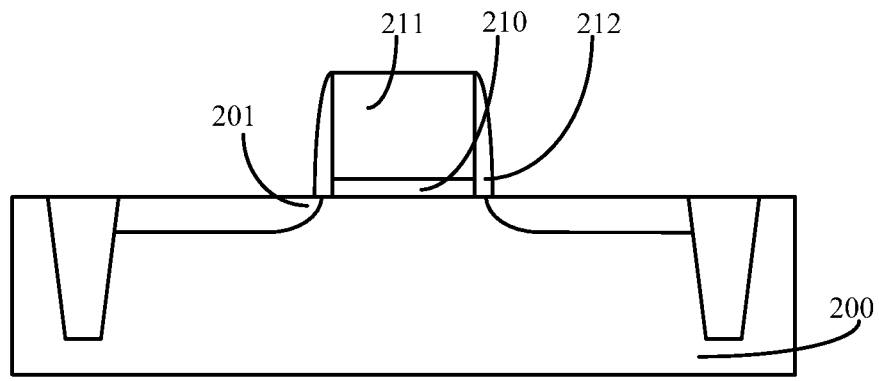
FIGS. 4-8 are schematics for an exemplary transistor at various stages during formation in accordance with various disclosed embodiments.

In FIG. 4, a substrate 200 is provided. A gate dielectric layer 210 is disposed on the surface of the substrate 200. A gate electrode layer 211 is formed on the surface of the gate dielectric layer 210. A first spacer 212 is formed on the surface of the substrate 200 on both sides of the gate electrode layer 211 and the gate dielectric layer 210. A lightly doped region 201 is formed in the substrate 200 on both sides of the gate electrode layer 211 and the first spacer 212 (e.g., Step 910 of FIG. 9).

The substrate 200 can provide a working platform for subsequent processes. The substrate 200 can be made of silicon, germanium, silicon-germanium, silicon carbide, silicon-on-insulator, and/or germanium-on-insulator. In an embodiment, the substrate 200 is made of silicon. When forming a PMOS transistor, a subsequently formed stress layer can be made of silicon-germanium. When forming a NMOS transistor, a subsequently formed stress layer can be made of silicon carbide.

In other embodiments, the substrate can be of silicon-germanium. When forming a PMOS transistor, a subsequently formed stress layer can be made of germanium. When forming a NMOS transistor, a subsequently formed stress layer can be made of silicon.

A crystal lattice mismatch is required between the subsequently formed stress layer and the substrate 200, such that a stress can be provided to the substrate 200 at the bottom of the gate electrode layer 211. An ion implantation process is employed to form a well region in the substrate 200. The type of doped ions in the well region is opposite to the type of doped ions in a subsequently formed source/drain region (i.e., a PN junction can be formed between each of the source/drain regions and the well region). When a reverse breakdown voltage of the PN junction is too low, a reverse breakdown current is easily to be generated between the PN junctions, so that a leakage current can occur between the source/drain region and the well region. In an exemplary embodiment, a first doped region can be subsequently formed to suppress the leakage current at the bottom of the stress layer.

A gate structure is formed on the surface of the substrate 200. A portion of the substrate 200 with the formed gate structure is isolated from the remaining portion of the substrate 200 using a shallow trench isolation structure (not illustrated). In an exemplary embodiment, in order to make the subsequently formed stress layer provide greater stress to the substrate 200 at the bottom of the gate electrode layer 211 (e.g., including a channel region), sidewalls of the formed stress layer extend into the substrate at the bottom of the gate electrode layer 211. Sidewalls of the stress layer with respect to the surface of the substrate 200 are configured to be an "Σ" shape. Crystalline direction of the surface of the substrate 200 is <100> or <110>, thus an anisotropic wet etching process can be employed to form a first opening having "Σ" shaped sidewalls. The first opening is used to form a stress layer.

The gate dielectric layer 210 can be made of silicon oxide. The gate electrode layer 211 can be made of polysilicon. The first spacer 212 can be made of silicon oxide, silicon carbide, and/or silicon oxynitride. The first spacer 212 can be used to protect the sidewalls of the gate electrode layer 211 and the gate dielectric layer 210.

A process for forming the gate electrode layer 211 and the gate dielectric layer 210 can include depositing a gate dielectric film on the surface of the substrate 200 using a deposition process, forming a gate electrode film on the surface of the gate dielectric film using a deposition process, and forming a gate electrode layer 211 and a gate dielectric layer 210 on the surface of the substrate 200 by employing a photolithography process and an etching process to remove a portion of the gate electrode film and a portion of the gate dielectric film.

A process for forming the first spacer 212 can include depositing a first spacer film on the surfaces of both the gate electrode layer 211 and the gate dielectric layer 210, and etching back the first spacer film until exposing the surface of the gate electrode layer 211 to form the first spacer.

In one embodiment, the gate dielectric layer 210 and the gate electrode layer 211 can subsequently be used to form a transistor. In another embodiment, a subsequently formed transistor can have a high-K metal gate (HKMG). A gate last process can be employed, after the subsequent formation of a second doped region, to remove the gate electrode layer 211 and the gate dielectric layer 210, and replace them (i.e., the gate electrode layer 211 and the gate dielectric layer 210) with a high-K gate dielectric layer and a metal gate.

In an exemplary embodiment, prior to the subsequent formation of a first doped region, a lightly doped region 201 is formed in the substrate 200 on both sides of the gate electrode layer 211 and the first spacer 212. The first spacer is used to define a location of the lightly doped region 201 and a distance between the lightly doped region and the gate electrode layer 211.

The lightly doped region 201 can inhibit doped ions in the source/drain region from diffusing into the substrate 200 at the bottom of the gate electrode layer 211, thereby suppressing a short channel effect. The type of doped ions in the lightly doped region 201 is the same type of doped ions doped in the subsequently formed source/drain region. In addition, the doped ion concentration in the lightly doped region 201 is lower than the doped ion concentration in the subsequently formed source/drain region. Thus diffusion of doped ions of the source/drain region can be reduced. Further, the depth of the lightly doped region 210 is less than the thickness of the subsequently formed stress layer and the depth of the subsequently formed first doped region.

An ion implantation process can be used to form the lightly doped region 201. In an exemplary embodiment, the formed transistor is a PMOS transistor. Thus the doped ions in the lightly doped region 201 are P-type ions including, e.g., boron ions and/or indium ions.

Figure 5:
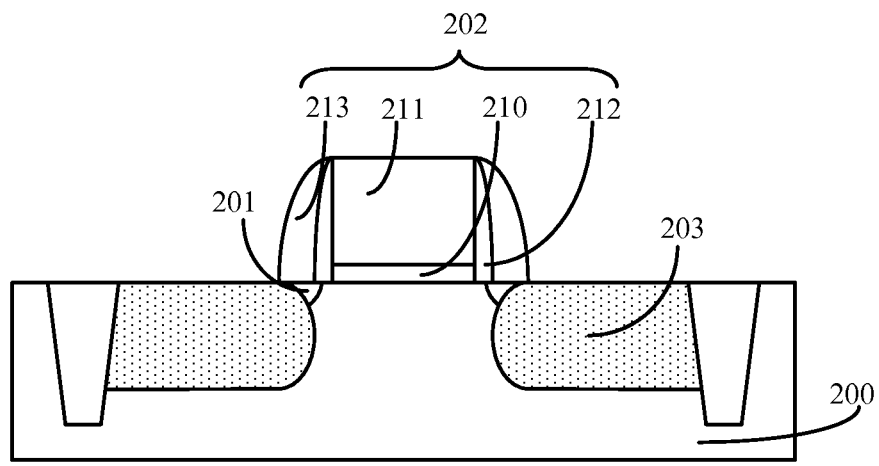

In FIG. 5, a second spacer 203 is formed on the surface of the substrate 200 on both sides of the gate electrode layer 211 and the first spacer 212. A gate structure 202 is formed including the gate dielectric layer 210, the gate electrode layer 211, the first spacer 212, and the second spacer 213. A first doped region 203 is formed in the substrate 200 on both sides of the gate structure 202 (e.g., Step 920 of FIG. 9).

The second spacer 213 can be made of silicon oxide, silicon nitride, or silicon oxynitride. A material for forming the second spacer 213 can be different from a material for forming the first spacer 212. The second spacer 213 can define a location of the first doped region 203 and a distance between the first doped region 203 and the gate electrode layer 211. A process for forming the second spacer 213 can be the same process for forming the first spacer.

In an exemplary embodiment, the first doped region 203 is formed prior to formation of a stress layer. The first doped region 203 surrounds the bottom of a subsequently formed stress layer. A depletion region can be formed between the well region and the first doped region 203 surrounding the bottom of the stress layer. The depletion region has a greater thickness than the depth of the stress layer, and can surround the bottom of the stress layer. The depletion region can reduce electric field strength between the bottom of the stress layer and the substrate 200, thereby decreasing a leakage current generated at the bottom of the stress layer.

A process of forming the first doped region 203 can be a first ion implantation process. The first ion implantation process can include a one-step or multi-step ion implantation. Since the first doped region 203 is formed prior to formation of a stress layer, the doping depth and the doping concentration in the first doped region 203 as well as the morphology of the first doped region 203 can be controlled by the first ion implantation process. Thus the doping concentration and morphology of the formed first doped region 203 can be precisely and readily controlled. Additionally, the morphology and doping concentration of the first doped region 203 are not affected by a second doped region subsequently formed in the stress layer (i.e., ions in the first doped region 203 do not diffuse easily). A short channel effect of the source region/drain region subsequently formed from the first doped region 203 and the second doped region can be suppressed.

In an exemplary embodiment, the formed transistor is a PMOS transistor. The first ion implantation process is a one-step ion implantation process. The first ion implantation process can include implanted ions (e.g., boron ions or boron fluoride gas ions), an implantation energy ranging from about 0.5 KeV to about 2 KeV, an implantation concentration ranging from about $1E13$ atom/cm$^2$ to about $2E14$ atom/cm$^2$, and an implantation angle ranging from about 0 degree to about 40 degrees. The implantation direction of the first ion implantation process is inclined with respect to the surface of the substrate 200. The formed first doped region 203 can extend into the substrate 200 under the bottom of the gate structure 202. Thus the first doped region 203 can be ensured to completely surround a subsequently formed stress layer.

In another embodiment, the formed transistor is an NMOS transistor. The first ion implantation process is a one-step ion implantation process. The first ion implantation process can include implanted ions (e.g., phosphorus ions or arsenic ions), an implantation energy ranging from about 0.5 KeV to about 3 KeV, an implantation concentration ranging from about $1E13$ atom/cm$^2$ to about $1E14$ atom/cm$^2$, and an implantation angle ranging from about 0 degree to about 40 degrees.

In other embodiments, the first ion implantation process can be a multi-step ion implantation process. The doping concentration of the formed first doped region can be inconsistent (e.g., gradually varied) with the bottom of the first doped region to the top of the first doped region to meet more process requirements.

Figure 6:
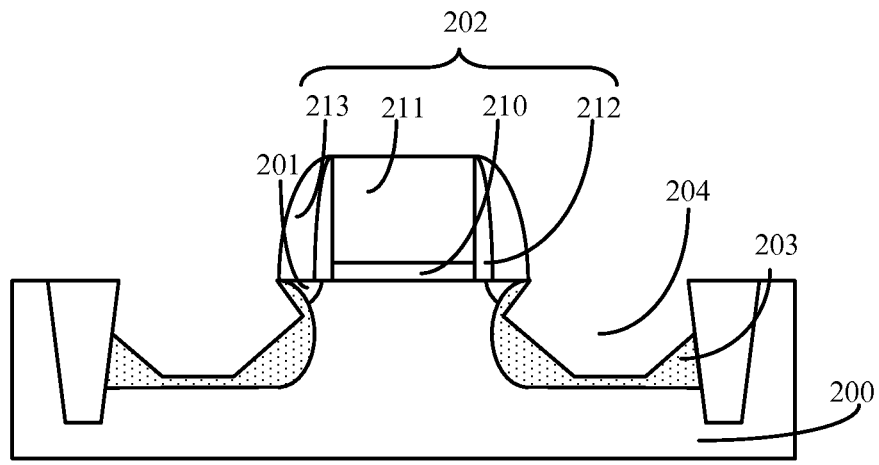

In FIG. 6, a first opening 204 can be formed in the substrate 200 on both sides of the gate structure 202. The sidewall of the first opening 204 extends into the substrate 200 under the bottom of the gate structure 202 (e.g., in some cases, under the gate dielectric layer 210). The sidewall of the first opening 204, adjacent to the gate structure 202, is configured to be an "Σ" shape with respect to the surface of the substrate 200 (e.g., Step 930 of FIG. 9).

The first opening 204 can be used to form a stress layer. In an exemplary embodiment, the sidewall of the first opening 204 is configured to be an "Σ" (sigma) shape with respect to the surface of the substrate 200. Additionally, a vertex of the sidewall of the first opening 204 extends into the substrate 200 under the bottom of the gate structure 202 (e.g., under the bottom of the gate electrode 211). In some embodiments, the distance between the gate structure 202 and the stress layer subsequently formed in the first opening 204 can be sufficiently small. Thus the channel region under the bottom of the gate structures 202 can have a greater stress. Carrier mobility can be increased and performance of the formed transistor can be improved.

A process for forming the first opening 204 can include forming a opening (not illustrated) in the substrate 200 on both sides of the gate structure 202 by employing an anisotropic dry etching process, the sidewall of the opening being perpendicular to the surface of the substrate 200; and etching the sidewall and the bottom of the opening using an anisotropic wet etching process to form the first opening 204, a vertex being formed on the sidewall and the vertex extending into the substrate 200 under the bottom of the gate structure 202.

The anisotropic dry etching process can include an etching gas (e.g., including chlorine, hydrogen bromide, or a mixed gas of chlorine and hydrogen bromide), a flow rate of hydrogen bromide ranging from about 200 sccm to about 800 sccm, a flow rate of chlorine ranging from about 20 sccm to about 100 sccm, a flow rate of inert gas ranging from about 50 sccm to about 1000 sccm, an etching chamber pressure ranging from about 2 mTorr to about 200 mTorr, and/or an etching time ranging from about 15 seconds to about 60 seconds.

The anisotropic wet etching process can include an etching solution. The etching solution can include a base solution, e.g., potassium hydroxide (KOH), sodium hydroxide (NaOH), lithium hydroxide (LiOH), ammonia (NH$_4$OH), tetramethyl ammonium hydroxide (TMAH), or a combination thereof.

In an exemplary embodiment, the crystalline direction of the surface of the substrate 200 can be <100> or <110>. The anisotropic wet etching process has a high etching rate in directions parallel to and perpendicular to the surface of the substrate 200, and a low etching rate in a crystalline direction of <111>. Thus, the sidewall of the formed first opening 204 can be configured to "Σ" shape with respect to the surface of the substrate 200.

Note that the first opening 204 is formed after formation of the first doped region 203. In addition, the doping depth of the first doped region 203 can be controlled. Thus, the depth of the first opening 204 can be determined according to the doping depth of the first doped region 203. The depth of the first opening 204 can be less than the depth of the first doped region 203. Consequently, the first doped region 203 can surround the bottom of the stress layer subsequently formed in the first opening 204. For example, the first doped region 203 can have a bottom deep in the substrate 200 and distanced from the bottom of the stress layer subsequently formed in the first opening 204.

Additionally, when forming the first opening 204, a portion of the first doped region 203 near the surface of the substrate 200 is removed. The first doped region 203, when subsequently forming a second doped region in the stress layer, can thus not affect the doped ion concentration of the second doped region. The doping depth and the doping concentration in the subsequently formed second doped region can be precisely controlled as well to suppress a short channel effect.

In another embodiment, a first opening can be formed prior to forming a first doped region. For example, after forming the first opening, the first doped region can be formed in the substrate outside of the bottom of the first opening. The doping depth, doping concentration, and morphology of the first doped region can be precisely controlled through a first ion implantation process. The first doped region can surround the bottom of the first opening, and thus surround the bottom of a subsequently formed stress layer. In addition, doping the substrate at the bottom of the first opening can reduce the amount of the doped ions and the energy of doped ions to save manufacturing costs.

In FIG. 7, a selective epitaxial deposition process is employed to from a stress layer 205 in the first opening 204 (as shown in FIG. 6). The thickness of the stress layer 205 is less than the depth of the first doped region 203. The bottom of the first doped region 203 surrounds the bottom of the stress layer 205 outside of the stress layer 205. The stress layer 205 contains a second doped region 209. The second doped region 209 and the first doped region 203 constitute a source region and a drain region (e.g., Step 940 of FIG. 9).

The stress layer 205 is used to provide a stress to the channel region at the bottom of the gate structure 202 to improve carrier mobility in the channel region. In an exemplary embodiment, the substrate 200 is made of silicon and the formed transistor is a PMOS transistor. The stress layer 205 is thus made of silicon-germanium, and is formed by a selective epitaxial deposition process. Crystal lattice mismatch occurs between the silicon-germanium and the silicon to apply a stress to the channel region. In other embodiments, when forming an NMOS transistor, the stress layer 205 is made of silicon carbide. The stress layer 205 can have a top surface above a top surface of the substrate 200.

In an exemplary embodiment, a process for forming the stress layer 205 can include forming a first stress sub-layer (not illustrated); and forming a second stress sub-layer (not illustrated) on the surface of the first stress sub-layer and completely filling the first opening 204, the first stress sub-layer and the second stress sub-layer constituting the stress layer 205. The first stress sub-layer can be formed, e.g., on a bottom surface and a sidewall portion of the first opening. In one embodiment, the first stress sub-layer and the second stress sub-layer can have an interface that includes the vertex and parallel to the surface of the substrate. In various embodiments, the interface there-between can be controlled at any plane along the thickness of the stress layer 205.

When stress layer 205 is made of silicon-germanium, the second stress sub-layer made of silicon-germanium can have a higher content of germanium to provide a greater stress to the channel region, compared with the first stress sub-layer made of silicon-germanium having a low content of germanium. The first stress sub-layer can be a transition between the second stress sub-layer and the substrate 200, such that a direct contacting interface between the stress layer 205 and the interface 200 of the substrate can have a desirable quality.

In other embodiments, after formation of a first stress sub-layer and prior to formation of a second stress sub-layer, a first ion implantation process can be employed to dope the first stress sub-layer and the substrate at the bottom of the first opening to form a first doped region. Thus, the substrate and the first stress sub-layer at the bottom of the first opening contain doped ions. When containing doped ions in the first stress sub-layer, the first stress sub-layer can be a transition between the first doped region 203 and the second doped region 209, so that a source/drain region configured from the first doped region and the second doped region can have a more stable performance.

In addition, when containing doped ions in the first stress sub-layer, a selective epitaxial process for subsequently forming the second stress sub-layer can have a more precise control. For example, after forming the first stress sub-layer and prior to forming the second stress sub-layer, the first doped region can be formed at least partially in the first stress sub-layer at the bottom of the opening and in the substrate. The doped ion concentration and the doped ion distribution in the formed second stress sub-layer can be regulated more accurately.

In an exemplary embodiment, the stress layer 205 is made of silicon-germanium. A selective epitaxial deposition process for forming the stress layer 205 can include a temperature ranging from about 500° C. to about 800° C., a pressure ranging from about 1 torr to about 100 torr, and deposition gases, e.g., including a silicon source gas ($SiH_4$ and/or $SiH_2Cl_2$), a germanium source gas ($GeH_4$), and/or a carbon source gas ($CH_4$, $CH_3Cl$, and/or $CH_2Cl_2$). A flow rate for each of the silicon source gas, the germanium source gas, and/or the carbon source gas can range from about 1 sccm to about 1000 sccm. The selective epitaxial deposition process can further include a HCl gas and a $H_2$ gas. A flow rate for the HCl gas can range from about 1 sccm to about 1000 sccm; and a flow rate for the $H_2$ can range from about 100 sccm to about 50,000 sccm.

In an exemplary embodiment, when forming the stress layer 205 using the selective epitaxial deposition process, an in-situ doping process can be employed to form a second doped region 209 in the stress layer 205. The conductive type of the doped ions in the second doped region can be consistent with the conductive type of the doped ions in the first doped region 203 (e.g., P type ions for a PMOS in an exemplary embodiment). The second doped region 209 and the first doped region 203 can constitute a source/drain region of the formed transistor.

When an in-situ doping process is employed to form a second doped region, the doped ion distribution and the doped ion concentration can be precisely controlled in the process to avoid the second doped region from diffusing, thereby suppressing a short channel effect. In an exemplary embodiment, the doped ion concentration in the second doped region is greater than the doped ion concentration in the first doped region 203. The second doped region is near the surface of the substrate 200 compared with the first doped region 203. In addition, the great concentration of the doped ions in the second doped region, along with the stress provided by the stress layer 205 to the channel region, can improve carrier mobility in the channel region to reduce leakage current.

Additionally, as described above, prior to forming the stress layer 205 and the first doped region 203, the lightly doped region 201 can be formed in the substrate 200 on both sides of the gate electrode layer 211 and the first spacer 212. The lightly doped region 201 can be used to prevent doped ions in the second doped region 209 from being diffused towards the channel region, the short channel effect can thus be suppressed.

Ions doped in the stress layer 205 using the in-situ doping process can further include nitrogen ions, carbon ions, and/or a combination thereof. The doping concentration can range from about 1E18 atom/$cm^2$ to about 3E19 atom/$cm^2$. The doped nitrogen ions or carbon ions can be used to regulate the concentration of P type or N type doped ions in the second doped region 209 to prevent the short channel effect according to a specific process.

In another embodiment, a process for forming a second doped region can include a second ion implantation process. The second ion implantation process can include a one-step or multi-step ion implantation process. The doped ions can be P type or N type. The doped ion distribution, the doping depth of doped ions, and/or the doped ion concentration in the second doped region can be accurately regulated in the second ion implantation process. Diffusion of doped ions of the second doped region can thus be suppressed, thereby reducing the short channel effect.

Note that a pad oxide layer can be formed on the surfaces of both the stress layer 205 and the substrate 200 prior to employing the second ion implantation process. A thermal oxidation process can be used to form the pad oxide layer. The pad oxide layer can protect the surface of the stress layer 205 from being damaged in the second ion implantation process.

In an exemplary embodiment, a first doped region 203 can be formed prior to forming the stress layer 205. The doping depth, the doped ion concentration, and the doped ion distribution in the first doped region 203 can be accurately controlled in a first ion implantation process. Additionally, the sizes of a top pattern and the bottom pattern of the first doped region 203 can be kept consistent with each other. When forming the stress layer 205, the thickness of the stress layer 205 can be controlled in the process to be less than the depth of the first doped region 203. Thus, the first doped region 203 can surround the bottom of the stress layer 205 from outside of the stress layer 205.

In a particular embodiment, the sidewall of the stress layer 205 has a vertex that extends into the substrate 200 under the bottom of the gate structure 202. The first doped region 203 can surround a portion of the stress layer 205 below the vertex. A depletion layer can be formed between the first doped region 203 surrounding the bottom of the stress layer 205 and the well region in the substrate 200. The depletion can suppress leakage current between the source region/drain region and the substrate.

In addition, the sidewall of the stress layer 205 lower the point of the vertex is inclined with respect to the bottom of the stress layer 205, so the size of the stress layer 205 at the bottom is smaller than the size of the stress layer 205 at the vertex plane parallel to the surface of the substrate 200. The first doped region 203 surrounding the sidewall of the stress layer 205 below the vertex extends outwardly. That is, the first doped region 203 surrounding the bottom of the stress layer 205 has a sufficiently large size. A great range of depletion layer can thus be formed between the first doped region 203 and the well region in the substrate 200. The depletion layer can significantly reduce the electric field strength between the stress layer 205 and the second doped region 209, and the substrate 200, to decrease leakage current.

Additionally, when forming the stress layer 205, a portion of the first doped region 203 is removed to form the first opening. The stress layer 205 is formed in the first opening. A second doped region 209 is formed in the stress layer 205. The doped ion concentration, the doped ion distribution, and/or the doping depth in the second doped region 209 can be precisely controlled in a doping process, and are not affected by the first doped region 203. This can curb the doped ions in the first doped region 203 and the second doped region 209 from diffusing, especially, in the direction parallel to the surface of the substrate 200. The short channel effect can thus be suppressed, and the overlap capacitance between the gate electrode layer and the source/drain region can be reduced as well.

In FIG. 8, after formation of the stress layer 205 and the second doped region 209, a third doped region 206 can be formed in an upper portion (within a top surface) of the stress layer 205 (e.g., Step 950 of FIG. 9).

A process for forming the third doped region 206 can include an ion implantation process. The type of doped ions in the third doped region 206 can be the same type of the doped ions in the first doped region 203 or the second doped region 209 (e.g., P type in an exemplary embodiment). In addition, the doped ion concentration of the third doped region 206 is greater than the doped ion concentration of the second doped region 209. The third doped region 206 can be used as a connection region between a subsequently formed electrical interconnect structure and the source/drain region. Since the third doped region 206 has a great concentration of dopant ions, a contact resistance between the electrical interconnect structure and the source/drain region can be reduced. As shown, the third doped region 206 can have a top surface over a top surface of the substrate 200.

Prior to formation of the third doped region 206, a pad oxide layer can be formed on the surfaces of both the stress layer 205 and the substrate 200. A process for forming the pad oxide layer can be a thermal oxidation process. The pad oxide layer can protect the surface of the stress layer 205 from being damaged during the formation of the third doped region 206.

Further, after forming the third doped region 206, a thermal annealing process can be employed to activate the first doped region 203, the second doped region 209, and/or the third doped region 206. Also, after the thermal annealing process, a self-aligned silicide process can be employed to form a conductive layer on the surface of the stress layer 205. The conductive layer is made of a metal silicide, e.g., nickel-silicon. The conductive layer can be used as a direct electrical connection layer between a subsequently formed conductive structure and the source/drain region.

Note that, after forming the third doped region 206, a dielectric layer can be formed on the surface of the substrate 200. The surface of the dielectric layer is flushed with the surface of the gate structure 202. After forming the dielectric layer, the gate electrode layer 211 and the gate dielectric layer 210 can be removed to form a second opening in the dielectric layer. A high-K gate dielectric layer is formed on the sidewall and bottom surface of the second opening. A metal gate electrode can then be formed on the surface of the high-K gate dielectric layer and completely fills the second opening. Optionally, a work function layer can be formed between the high-K gate dielectric layer and the metal gate electrode. The work function layer can be used to regulate the threshold voltage of a formed transistor.

In an exemplary embodiment, a first doped region and a stress layer can be formed in the substrate on both sides of the gate structure. The thickness of the stress layer is less than the depth of the first doped region. The bottom of the first doped region surrounds the bottom of the stress layer. Since the first doped region surrounds the stress layer, a depletion layer formed between the first doped region and the substrate can be expanded. The depletion layer can reduce electrical field strength between the bottom of the stress layer and the substrate to suppress leakage current between the bottom of the stress layer and the substrate. In addition, after forming the stress layer and the first doped region, a second doped region can be formed in the stress layer. The doping parameters (e.g., doping depth and doping concentration) of the second doped region can be precisely controlled in a doping process. Thus, diffusion of the formed second doped region can be curbed by a doping process to avoid occurrence of a short channel effect. Consequently, in an exemplary embodiment, when the formed first doped region and the second doped region are used as a source/drain region, the leakage current can be suppressed and the short channel effect can be voided, thereby forming a transistor with an enhanced performance.

Other applications, advantages, alternations, modifications, or equivalents to the disclosed embodiments are obvious to those skilled in the art.

What is claimed is:

1. A method for fabricating a transistor, comprising:
providing a substrate;
forming a gate structure on a surface of the substrate;
forming a first doped region in the substrate by a first ion implantation on both sides of the gate structure;
forming an opening within the first doped region, wherein the opening has a depth in the substrate less than a depth of the first doted region, and a bottom of the first doped region in the substrate is outside of the opening to surround a bottom of the opening;
forming a stress layer to fill up the opening within the first doped region on the both sides of the gate structure, wherein the stress layer has a thickness in the substrate less than the depth of the first doped region, and the bottom of the first doped region in the substrate is outside of the stress layer to surround a bottom of the stress layer; and
forming a second doped region within the stress layer, wherein the second doped region and the first doped region form a source region or a drain region.

2. The method of claim 1, wherein the first doped region is formed after forming the opening and prior to forming the stress layer.

3. The method of claim 1, wherein forming the stress layer includes a selective epitaxial deposition process in the opening.

4. The method of claim 1, wherein the opening has a sidewall including a vertex extending into the substrate under a bottom of the gate structure.

5. The method of claim 1, wherein forming the stress layer includes:
forming a first stress sub-layer on a bottom surface and a sidewall portion of the opening; and
forming a second stress sub-layer on the first stress sub-layer to at least completely fill the opening, wherein the stress layer includes the first stress sub-layer and the second stress sub-layer.

6. The method of claim 1, further comprising forming the second doped region in the stress layer with an in-situ doping process such that the second doped region and the first doped region have a same conductive type.

7. The method of claim 1, wherein the first ion implantation process is a one-step ion implantation process or a multi-step ion implantation process.

8. The method of claim 1, wherein the second doped region is formed by a second ion implantation process, and wherein the second ion implantation process includes a one-step ion implantation process or multi-step ion implantation process.

9. The method of claim 1, wherein forming the gate structure includes:
forming a gate dielectric layer on the substrate;
forming a gate electrode layer on the gate dielectric layer;
forming a first spacer on the substrate on both sidewalls of the gate electrode layer and the gate dielectric layer; and
forming a second spacer on the substrate and on sidewalls of the first spacer.

10. The method of claim 1, further including forming a third doped region in an upper portion of the stress layer after forming the second doped region in the stress layer.

11. The method of claim 1, wherein the second doped region is formed within the stress layer to have a top surface lower than a top surface of the stress layer and lower than a top surface of the substrate.

12. The method of claim 1, wherein the stress layer is formed after the first doped layer is formed.

13. The method of claim 5, wherein, after forming the first stress sub-layer and prior to forming the second stress sub-layer, the first doped region is formed at least partially in the first stress sub-layer at the bottom of the opening and in the substrate.

14. The method of claim 6, wherein the in-situ doping process includes using nitrogen ions, carbon ions; or a combination thereof, and a doping concentration ranging from about 1E18 atom/cm$^2$ to about 3E19 atoms cm$^2$.

15. The method of claim 7, wherein the transistor is a PMOS transistor and the first ion implantation process uses implantation ions including boron ions or boron fluoride ions, an implantation energy ranging from about 0.5 KeV to about 2 KeV, an implantation concentration ranging from about 1E13 atom/cm$^2$ to about 2E14 atom/cm$^2$, and an implantation angle ranging from about 0 degree to about 40 degrees.

16. The method of claim 7, wherein the transistor an NMOS transistor and the first ion implantation process uses implantation ions including phosphorus ions or arsenic ions, an implantation energy ranging from about 0.5 KeV to about 3 KeV, an implantation concentration ranging from about 1E13 atom/cm$^2$ to about 1E14 atom/cm$^2$, and an implantation angle ranging from about 0 degree to about 40 degrees.

17. The method of claim 9, wherein after forming the first spacer and prior to forming the second spacer, a lightly doped region is formed in the substrate on the both sides of the first spacer, wherein the lightly doped region has a depth less than a thickness of the stress layer.

18. The method of claim 10, wherein the third doped region in the stress layer is formed on the second doped region in the stress layer.

19. The method of claim 10, wherein the stress layer includes a non-doped portion of the stress layer, the second doped region formed on the non-doped portion, and the third doped region formed on the second doped region.

20. The method of claim 10, wherein the third doped region in the stress layer has a conductive type same as the second doped region and the first doped region.

* * * * *